US012597927B2

(12) United States Patent
Jain

(10) Patent No.: US 12,597,927 B2
(45) Date of Patent: Apr. 7, 2026

(54) FLIP-FLOP WITH SELF CORRECTION

(71) Applicant: STMicroelectronics International N.V., Geneva (CH)

(72) Inventor: Abhishek Jain, Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/632,137

(22) Filed: Apr. 10, 2024

(65) Prior Publication Data

US 2024/0356549 A1 Oct. 24, 2024

Related U.S. Application Data

(60) Provisional application No. 63/497,641, filed on Apr. 21, 2023.

(51) Int. Cl.
*H03K 19/003* (2006.01)
*H03K 3/037* (2006.01)

(52) U.S. Cl.
CPC ..... *H03K 19/00338* (2013.01); *H03K 3/0372* (2013.01); *H03K 3/0375* (2013.01)

(58) Field of Classification Search
CPC ...... H03K 3/037; H03K 3/0372; H03K 19/21; H03K 3/012; H03K 3/0375; H03K 19/00338
See application file for complete search history.

(56) References Cited

U.S. PATENT DOCUMENTS

| | | | | |
|---|---|---|---|---|
| 5,233,617 A | * | 8/1993 | Simmons | H03K 3/0375 |
| | | | | 327/198 |
| 6,127,864 A | * | 10/2000 | Mavis | H03K 3/0375 |
| | | | | 327/295 |
| 6,150,861 A | * | 11/2000 | Matsunaga | H03K 3/0375 |
| | | | | 327/202 |
| 6,181,179 B1 | * | 1/2001 | Kanba | G01R 31/318541 |
| | | | | 327/212 |

(Continued)

FOREIGN PATENT DOCUMENTS

| | | | | |
|---|---|---|---|---|
| CN | 107925402 A | * | 4/2018 | G06F 1/10 |
| CN | 108631772 A | * | 10/2018 | H03K 19/003 |

(Continued)

OTHER PUBLICATIONS

Petrovic et al., "Redundant Circuits with Latchup Protection," 2013 IEEE, pp. 117-120.

(Continued)

*Primary Examiner* — Lincoln D Donovan
*Assistant Examiner* — James G Yeaman
(74) *Attorney, Agent, or Firm* — Seed Intellectual Property Law Group LLP

(57) ABSTRACT

A radiation hardened flip-flop includes a plurality of secondary flip-flops. Each secondary flip-flop includes both a data input terminal and an alternate data input terminal. Each secondary flip-flop also includes an enable terminal that selectively enables use of the alternate data input terminal. The radiation hardened flip-flop includes an error detection circuit that detects whether an error is present in one or more of the secondary flip-flops and provides an enable signal to the enable terminals indicating the presence or absence of an error in one or more of the secondary flip-flops.

20 Claims, 7 Drawing Sheets

(56) References Cited

U.S. PATENT DOCUMENTS

| | | | | |
|---|---|---|---|---|
| 6,362,674 | B1 * | 3/2002 | Kermani | H04L 25/085 |
| | | | | 327/217 |
| 9,225,321 | B2 * | 12/2015 | Bal | H04L 7/0045 |
| 10,355,671 | B1 * | 7/2019 | Mao | H03K 3/35625 |
| 10,547,311 | B2 * | 1/2020 | Venugopal | G06F 1/08 |
| 11,296,700 | B1 * | 4/2022 | Rao | H03K 3/356121 |
| 2002/0074609 | A1 * | 6/2002 | Maruyama | H03K 3/35625 |
| | | | | 257/390 |
| 2005/0262406 | A1 * | 11/2005 | Boerstler | H03K 21/406 |
| | | | | 714/724 |
| 2007/0216465 | A1 * | 9/2007 | Takahashi | G11C 11/4074 |
| | | | | 327/333 |
| 2008/0218235 | A1 * | 9/2008 | Sekine | H03K 3/35625 |
| | | | | 327/212 |
| 2010/0026338 | A1 * | 2/2010 | Fulcomer | H03K 19/00338 |
| | | | | 326/11 |
| 2010/0153824 | A1 * | 6/2010 | Pribbernow | H03K 3/0375 |
| | | | | 714/780 |
| 2012/0182047 | A1 * | 7/2012 | Nomura | H03K 19/1776 |
| | | | | 326/54 |
| 2013/0169331 | A1 * | 7/2013 | Jain | G06F 11/1608 |
| | | | | 327/199 |
| 2013/0187686 | A1 * | 7/2013 | Yuan | H03K 3/0375 |
| | | | | 327/117 |
| 2015/0188519 | A1 * | 7/2015 | Singhal | H03K 3/0375 |
| | | | | 327/199 |
| 2015/0198663 | A1 * | 7/2015 | Syed | G01R 31/31727 |
| | | | | 714/726 |
| 2016/0087611 | A1 * | 3/2016 | Sharma | H03K 3/35625 |
| | | | | 327/202 |
| 2016/0173090 | A1 * | 6/2016 | Meinerzhagen | |
| | | | | H03K 19/00323 |
| | | | | 327/145 |
| 2017/0012611 | A1 * | 1/2017 | Escobar | H03K 3/012 |
| 2017/0212972 | A1 * | 7/2017 | Pillay | G11C 29/52 |
| 2018/0091149 | A1 * | 3/2018 | Kuenemund | H03K 3/3562 |
| 2018/0375500 | A1 * | 12/2018 | Hsieh | H03K 3/356104 |
| 2019/0288691 | A1 * | 9/2019 | Mazumder | G11C 7/1087 |
| 2019/0372563 | A1 * | 12/2019 | Mao | H03K 3/013 |
| 2020/0033406 | A1 * | 1/2020 | Wang | H03K 21/38 |
| 2020/0036538 | A1 * | 1/2020 | Ramlall | H03K 3/037 |
| 2020/0059223 | A1 * | 2/2020 | Samra | H03K 3/356026 |
| 2020/0387426 | A1 * | 12/2020 | Jain | G06F 11/076 |
| 2020/0389156 | A1 * | 12/2020 | Gupta | H03K 19/007 |
| 2021/0194468 | A1 * | 6/2021 | Agarwal | G01R 31/318536 |
| 2021/0203311 | A1 * | 7/2021 | Liu | H03K 3/037 |
| 2021/0239758 | A1 * | 8/2021 | Deligiannis | H03K 3/00 |
| 2022/0109445 | A1 * | 4/2022 | Rao | H03K 3/35625 |
| 2023/0051554 | A1 * | 2/2023 | Arora | H03K 19/20 |

FOREIGN PATENT DOCUMENTS

| | | | | | |
|---|---|---|---|---|---|
| CN | 114417758 | A | * | 4/2022 | H03K 19/0016 |
| CN | 114417760 | A | * | 4/2022 | G06F 30/33 |
| DE | 19602517 | A1 | * | 8/1996 | G01R 31/3183 |
| DE | 19636083 | A1 | * | 3/1997 | H03K 17/693 |
| DE | 102013211135 | A1 | * | 12/2014 | H03K 3/0375 |
| DE | 102021107879 | A1 | * | 6/2022 | G11C 29/48 |
| EP | 0477706 | A2 | * | 4/1992 | H03K 3/0375 |
| EP | 0541840 | A1 | * | 5/1993 | H03K 3/037 |
| EP | 3379764 | A1 | * | 9/2018 | H04L 7/0041 |
| EP | 3407530 | A1 | * | 11/2018 | H04L 9/004 |
| JP | WO2002047267 | A1 | * | 4/2004 | H03K 3/037 |
| JP | 2014511599 | A | * | 5/2014 | H03K 3/0372 |
| KR | 950013403 | B1 | * | 11/1995 | H03K 3/286 |
| KR | 100325479 | B1 | * | 8/2002 | H03K 19/20 |
| WO | WO-9638915 | A1 | * | 12/1996 | H03K 3/037 |
| WO | WO-2008015494 | A1 | * | 2/2008 | H03K 3/012 |
| WO | WO-2019106225 | A1 | * | 6/2019 | G06F 1/3296 |

OTHER PUBLICATIONS

Schrape et al., "Design and Evaluation of Radiation-Hardened Standard Cell Flip-Flops," *IEEE Transactions on Circuits and Systems-I: Regular Papers* 68(11):4796-4809, Nov. 2021.

Wang et al., "A Novel Radiation-Hardened CCDM-TSPC Compared with Seven Well-Known RHBD Flip-Flops in 180 nm CMOS Process," *Electronics* 11:3098, 2022. (17 pages).

* cited by examiner

| IN−1 | IN−2 | OUT |
|------|------|-----|
| 0 | 0 | 1 |
| 1 | 1 | 0 |
| 0 | 1 | PREVIOUS VALUE RETAINED |
| 1 | 0 | |

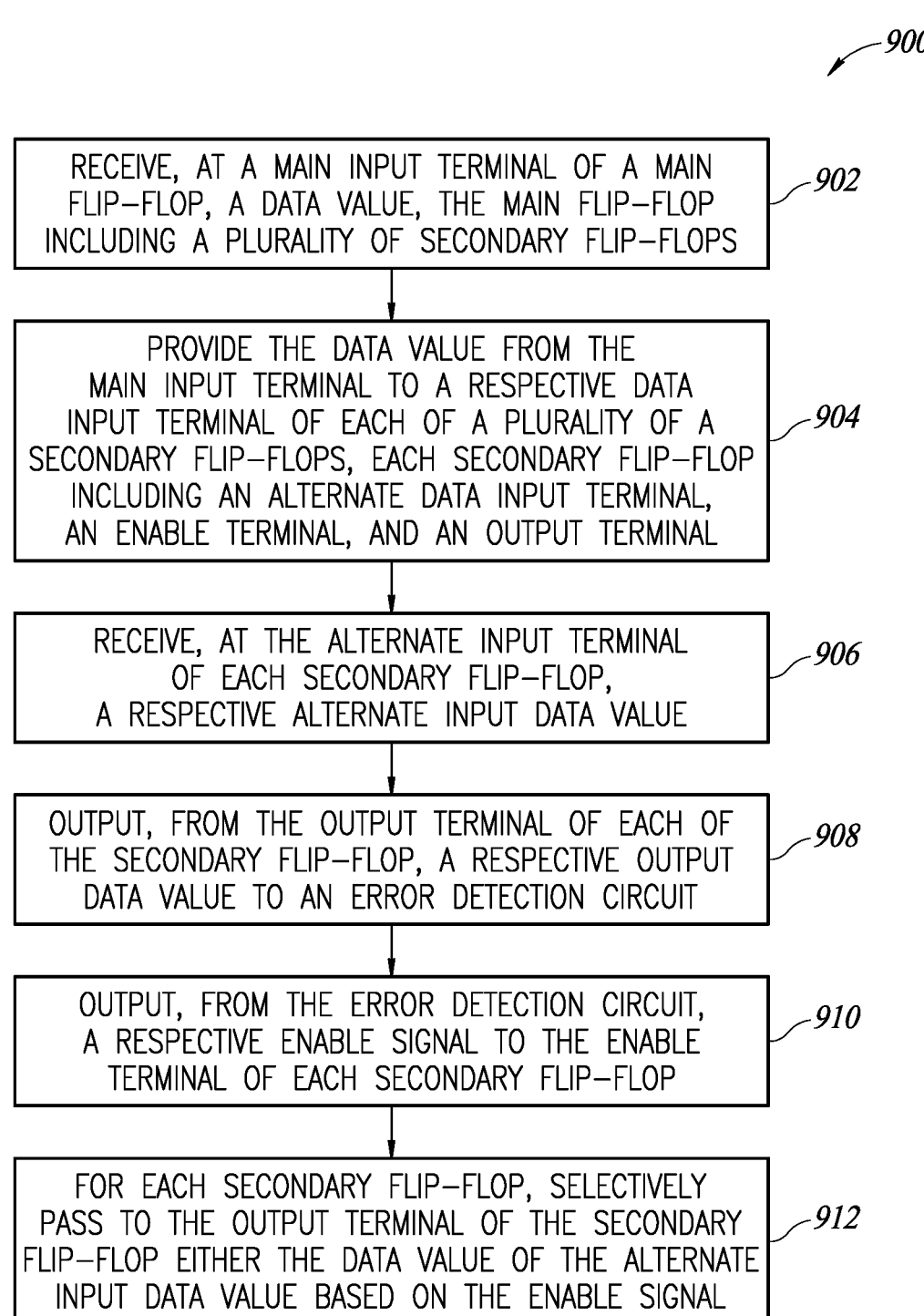

RECEIVE, AT A MAIN INPUT TERMINAL OF A MAIN FLIP-FLOP, A DATA VALUE, THE MAIN FLIP-FLOP INCLUDING A PLURALITY OF SECONDARY FLIP-FLOPS ⟋902

PROVIDE THE DATA VALUE FROM THE MAIN INPUT TERMINAL TO A RESPECTIVE DATA INPUT TERMINAL OF EACH OF A PLURALITY OF A SECONDARY FLIP-FLOPS, EACH SECONDARY FLIP-FLOP INCLUDING AN ALTERNATE DATA INPUT TERMINAL, AN ENABLE TERMINAL, AND AN OUTPUT TERMINAL ⟋904

RECEIVE, AT THE ALTERNATE INPUT TERMINAL OF EACH SECONDARY FLIP-FLOP, A RESPECTIVE ALTERNATE INPUT DATA VALUE ⟋906

OUTPUT, FROM THE OUTPUT TERMINAL OF EACH OF THE SECONDARY FLIP-FLOP, A RESPECTIVE OUTPUT DATA VALUE TO AN ERROR DETECTION CIRCUIT ⟋908

OUTPUT, FROM THE ERROR DETECTION CIRCUIT, A RESPECTIVE ENABLE SIGNAL TO THE ENABLE TERMINAL OF EACH SECONDARY FLIP-FLOP ⟋910

FOR EACH SECONDARY FLIP-FLOP, SELECTIVELY PASS TO THE OUTPUT TERMINAL OF THE SECONDARY FLIP-FLOP EITHER THE DATA VALUE OF THE ALTERNATE INPUT DATA VALUE BASED ON THE ENABLE SIGNAL ⟋912

FIG. 9

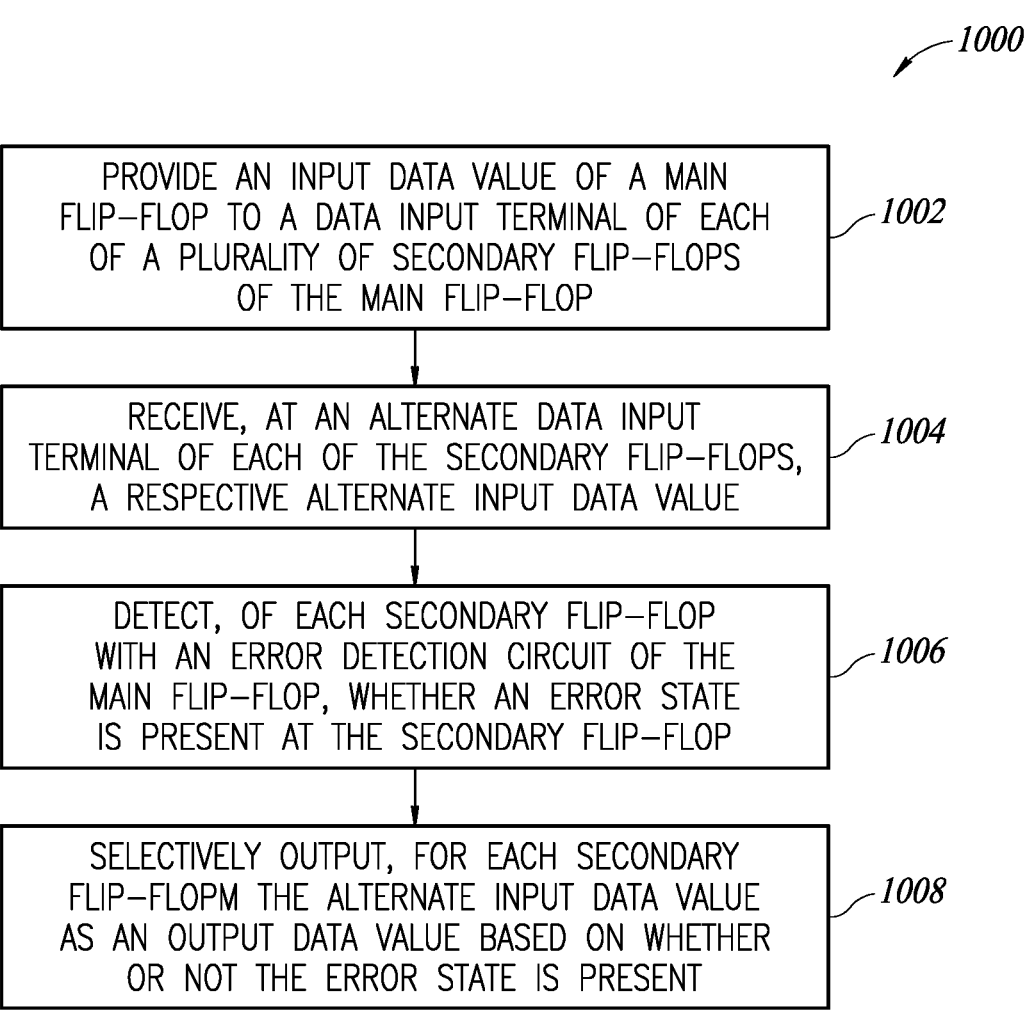

~1000

~1002 PROVIDE AN INPUT DATA VALUE OF A MAIN FLIP-FLOP TO A DATA INPUT TERMINAL OF EACH OF A PLURALITY OF SECONDARY FLIP-FLOPS OF THE MAIN FLIP-FLOP

~1004 RECEIVE, AT AN ALTERNATE DATA INPUT TERMINAL OF EACH OF THE SECONDARY FLIP-FLOPS, A RESPECTIVE ALTERNATE INPUT DATA VALUE

~1006 DETECT, OF EACH SECONDARY FLIP-FLOP WITH AN ERROR DETECTION CIRCUIT OF THE MAIN FLIP-FLOP, WHETHER AN ERROR STATE IS PRESENT AT THE SECONDARY FLIP-FLOP

~1008 SELECTIVELY OUTPUT, FOR EACH SECONDARY FLIP-FLOPM THE ALTERNATE INPUT DATA VALUE AS AN OUTPUT DATA VALUE BASED ON WHETHER OR NOT THE ERROR STATE IS PRESENT

FIG. 10

FLIP-FLOP WITH SELF CORRECTION

BACKGROUND

Technical Field

The present disclosure generally relates to flip-flops, and more particularly to triple modular flip-flops.

Description of the Related Art

Some integrated circuits are utilized in particularly sensitive devices or systems. Such sensitive devices can include medical devices, infrastructure management systems, space-based telecommunications systems, or other types of systems. In such sensitive systems, failure of an integrated circuit can result in serious negative consequences to individuals and communities.

Integrated circuits often include combinatorial logic circuits. The combinatorial logic circuits may participate in various processes germane to the function of the integrated circuit. In sensitive devices or systems, failure of a combinatorial logic circuit of an integrated circuit could result in malfunction or failure of the device or system in which the integrated circuit takes part.

Flip-flops are common components of combinatorial logic circuits. In some situations, it is possible that a transient circumstance could result in the erroneous change in the data value of a flip-flop. Accordingly, it may be beneficial to protect flip-flops of combinatorial logic circuits from erroneous changes the data values due to the occurrence of transient events.

BRIEF SUMMARY

Embodiments of the present disclosure provide a main flip-flop that is highly resistant to erroneous changes in data values due to transit events. The main flip-flop is made up of a plurality of secondary flip-flops that each receive, on a data input terminal, the data value supplied to the main flip-flop. Each flip-flop also includes an alternate data input terminal and an enable terminal. The main flip-flop includes an error detection circuit that receives the output of each secondary flip-flop and determines whether an error state is present in any of the secondary flip-flops. If an error state is present in any of the secondary flip-flops, the error detection circuit provides an enable signal to the corresponding secondary flip-flop. The enable signal causes the secondary flip-flop to pass an alternate data value at the alternate data input terminal to the output terminal of the secondary flip-flop. This removes the error state from the secondary flip-flop.

In one embodiment, the combination of the enable signal and the alternate data input enable a secondary flip-flop to resolve an erroneous state regardless of a state of a clock signal provided to the secondary flip-flop. This can be particularly beneficial in instances in which a low frequency clock signal is provided to the secondary flip-flops. When the enable signal goes high, the alternate data value is provided to the output terminal of the secondary flip-flop without regard to the clock signal. The result is that errors in the secondary flip-flop are resolved substantially immediately, thereby preventing an accumulation of errors in the secondary flip-flops over time.

In embodiment, a device includes a main flip-flop including a main data input terminal, a main data output terminal, and a plurality of secondary flip-flops. Each secondary flip-flop includes a data input terminal coupled to the main data input terminal, a data output terminal, an alternate data input terminal; and an enable terminal configured to selectively enable the data input port or the data output port.

In one embodiment, a method includes receiving, at a main input terminal of a main flip-flop, a data value, the main flip-flop including a plurality of secondary flip-flops and providing the data value from the main input terminal to a respective data input terminal of each of a plurality of secondary flip-flops. Each secondary flip-flop including an alternate data input terminal, an enable terminal, and an output terminal. The method includes receiving, at the alternate input terminal of each secondary flip-flop, a respective alternate input data value and outputting, from the output terminal of each of the secondary flip-flops, a respective output data value to an error detection circuit. The method includes outputting, from the error detection circuit, a respective enable signal to the enable terminal of each secondary flip-flop and for each secondary flip-flop, selectively passing to the output terminal of the secondary flip-flop either the data value or the alternate input data value based on the enable signal.

In one embodiment, a method includes providing an input data value of a main flip-flop to a data input terminal of each of a plurality of secondary flip-flops of the main flip-flop and receiving, at an alternate data input terminal of each of the secondary flip-flops, a respective alternate input data value. The method includes detecting, for each secondary flip-flop with an error detection circuit of the main flip-flop, whether an error state is present at the secondary flip-flop and selectively outputting, for each secondary flip-flop, the alternate input data value as an output data value based on whether or not the error state is present.

BRIEF DESCRIPTION OF THE SEVERAL VIEWS OF THE DRAWINGS

FIG. 9 is a flow diagram of a method for operating a main flip-flop, in accordance with some embodiments.

FIG. 10 is a flow diagram of a method for operating a main flip-flop, in accordance with some embodiments.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known systems, components, and circuitry associated with integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
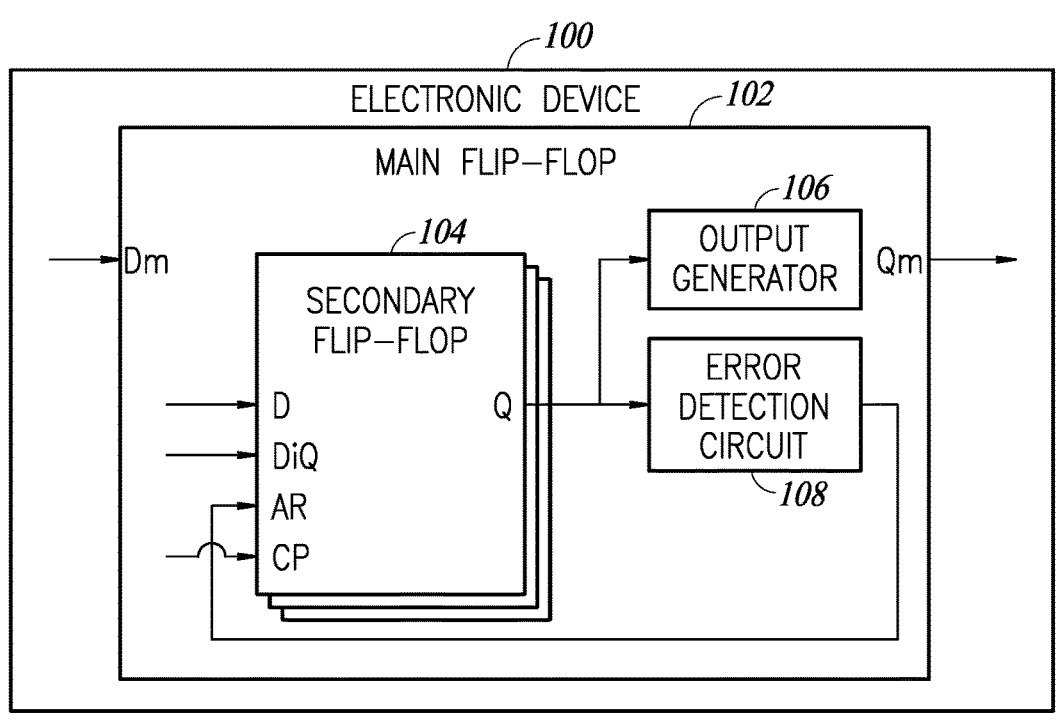
FIG. 1 is a block diagram of an electronic device including a main flip-flop, in accordance with some embodiments.

FIG. 1 is a block diagram of a block diagram of an electronic device 100, in accordance with some embodiments. The electronic device 100 includes a main flip-flop 102. As will be set forth in more detail below, the components and configuration of the main flip-flop 102 results in the main flip-flop 102 being highly resistant to erroneous changes the data values due to transit events.

In one embodiment, the electronic device 100 is a sensitive device or is part of a sensitive system. Failure of a component of the electronic device 100 could result in malfunction or failure of the electronic device 100 or of a system in which the electronic device 100 takes part. In sensitive applications, such a failure could result in negative consequences to individuals, communities, or organizations.

In one embodiment, the electronic device 100 is a medical device. The medical device can include a pacemaker, an automatic insulin distribution device, and automatic medication distribution device, a heart rate monitor, a defibrillator, or other types of medical devices. The failure of such a medical device can result in negative consequences to an individual.

In one embodiment, the electronic device 100 is part of the sensitive communication system. For example, the electronic device 100 can be part of a space-based communication system, a communication system that monitors or controls traffic, air traffic, power distribution, or other types of functions. Failure of a component of the electronic device 100 can result in malfunction or failure of the system.

The electronic device 100 includes a main flip-flop 102. The main flip-flop 102 can be part of an integrated circuit included in the electronic device 100. The main flip-flop 102 can be part of a combinatorial logic circuit of the electronic device 100.

The main flip-flop 102 may correspond to a radiation hardened flip-flop. Flip-flops may be susceptible to erroneous changes the data output resulting from radiation events. Radiation events can include the impact by charged particles or other types of high energy radiation that results in an erroneous change to the output of the flip-flop. For example, if an alpha particle (a helium atom stripped of electrons)

impacts a particular node within a flip-flop, it is possible that the output of the flip-flop could change states in an unintended manner. In sensitive devices or systems, such an erroneous change in a flip-flop could result in a change in the logic state that propagates into malfunction of the device or system.

One possible solution to reduce the possibility of erroneous changes in the output of a flip-flop is to utilize a triple modular redundancy (TMR) flip-flop. A TMR flip-flop may be made up of three individual flip-flops. The output of the TMR flip-flop is based on the output of each of the individual flip-flops. The output of the TMR flip-flop may correspond to the majority output of the three individual flip-flops. If one of the individual flip-flops has a different value than the other two individual flip-flops due to an error induced by the radiation event or other type of transit event, then the output of the TMR flip-flop will not change. However, one potential drawback to this solution is that in low-power applications, the clock frequency may be very low. The result is that an error in an individual flip-flop may not be corrected for a relatively long duration of time until a next rising edge of the clock signal. During this relatively long duration, it is possible that a transient there may be induced in another of the individual flip-flops of the TMR flip-flop. This would result in an erroneous change in the output of the TMR flip-flop.

In one embodiment, the main flip-flop 102 is a triple modular redundancy (TMR) flip-flop that overcomes the drawbacks of the potential solution described above. The main flip-flop 102 includes a plurality of secondary flip-flops 104 and an error correction circuit 108. As will be set forth in more detail below, the configuration of the secondary flip-flops 104 and the error correction circuit 108 cooperate to rapidly an error state induced in any one of the secondary flip-flops 104 regardless of a state of the clock signal.

As used herein, the term "main flip-flop" corresponds to a radiation hardened flip-flop that includes multiple redundant secondary flip-flops. Accordingly, as used herein, the term "secondary flip-flop" refers to a redundant flip-flop of a radiation hardened flip-flop. The secondary flip-flops may be described as redundant flip-flops or sub-flip-flops.

The main flip-flop 102 includes a main input terminal Dm and a main output terminal Qm. The main input terminal Dm receives an input data value. The main output terminal Qm provides an output data value of the main flip-flop 102. The circuitry of the main flip-flop 102 cooperates to ensure that the output data value is not erroneously changed by a radiation event.

Each secondary flip-flop 104 includes an input terminal D. Each secondary flip-flop receives, at the input terminal D, the data value received at the main data input terminal of the main flip-flop. In one embodiment, the data input terminal of each of the secondary flip-flops 104 receives the input data value from the main data input substantially simultaneously.

Each secondary flip-flop 104 includes a data output terminal Q and a clock input terminal CP. During standard operation in which there is no error state, the data value at the data input terminal D will be passed to the data output terminal Q upon the rising or falling edge (as the case may be) of the clock signal received at CP.

The main flip-flop 102 includes an output generator 106. The output generator 106 includes an input side that is coupled to the data output terminal Q of two or more of the secondary flip-flops 104. The output generator 106 includes an output side coupled to the main output Qm of the main flip-flop 102. The output generator 106 provides the output data value to the main data output terminal QM of the main flip-flop 102.

In one embodiment, the output generator 106 receives the output data value from two of the secondary flip-flops 104. If there is any difference in the output data values of the two secondary flip-flops 104, then the output generator 106 does not change the output data value of the main flip-flop 102 from the previous value because disagreement in the output data values of the two secondary flip-flops 104 indicates that an error is present in the lease one of the secondary flip-flops 104. If the output data values of the two secondary flip-flops 104 are identical, then the output generator 106 provides that data value at the main data output terminal Qm.

In one embodiment, the output generator 106 receives the output data value from all of the secondary flip-flops 104. In an example in which there are three or more secondary flip-flops 104, the output generator 106 may simply output the majority data value. As an example, if the output generator 106 receives the output data value from three of the secondary flip-flops 104, then the output generator 106 outputs a data value corresponding to the value output by at least two of the secondary flip-flops 104. Various schemes can be utilized by the output generator 106 without departing from the scope of the present disclosure.

Returning to the secondary flip-flops 104, each secondary flip-flop 104 includes an alternate data input terminal DiQ. The alternate data input terminal DiQ receives an alternate data value. As will be set forth in more detail below, if a secondary flip-flop 104 is in an error state, the alternate data value at DiQ may be passed to the data output terminal Q.

In one embodiment, the alternate data input terminal DiQ of each secondary flip-flop 104 receives the current output data value of the main data output terminal QM of the main flip-flop 102. Accordingly, if an error state is detected in a secondary flip-flop 104, the output data value of the main flip-flop 102 will be passed from the alternate data input terminal DiQ to the output terminal Q.

In one embodiment, the alternate data input terminal DiQ of each secondary flip-flop 104 receives the output data value of another of the secondary flip-flops 104. Accordingly, if an error is detected in a secondary flip-flop 104, the output data value of another of the secondary flip-flops 104 will be passed to the data output terminal Q of the secondary flip-flop 104 in the error state.

Each secondary flip-flop 104 includes an enable terminal AR. The enable terminal AR receives and enable signal. In one embodiment, if the enable signal is low, the secondary flip-flop 104 operates in a standard manner and the data value at the data input terminal D is passed to the data output terminal Q in accordance with the clock signal CP. If the enable signal goes high, then the secondary flip-flop may immediately provide the alternate data value from the alternate data input terminal DiQ to the data output terminal Q.

The error detection circuit one includes an input side. The input side receives the output data value from each of the secondary flip-flops 104. In other words, the input side of the error detection circuit one includes a plurality of inputs each coupled to the data output terminal Q of a respective secondary flip-flop 104. The error detection circuit one includes an output side. The output side is coupled to the enable terminal AR of each of the secondary flip-flops 104.

In one embodiment, the error detection circuit one receives the output data value of each of the secondary flip-flops 104 and detects whether or not one of the secondary flip-flops 104 is in an error state. If an error is detected in one of the secondary flip-flops 104, the error detection circuit one may cause the enable signal provided to one or more of the secondary flip-flops 104 to go high, indicating an error state. This causes the one or more secondary flip-flops 104 that receive the high enable signal to immediately pass the alternate data value to the data output terminal Q.

In one embodiment, the error detection circuit one provides a separate enable signal to each of the secondary flip-flops 104. The error detection circuit 104 is configured to detect whether or not each individual secondary flip-flop 104 is in an error state. If a particular secondary flip-flop 104 is detected to be in an error state, the error detection circuit causes the enable signal provided to that secondary flip-flop 104 to go high. The error signals provided to secondary flip-flops 104 that are not detected to be an error state remain low.

In one embodiment, the error detection circuit one detects whether or not a secondary flip-flop 104 is in an error state based on whether the output of that secondary flip-flop 104 is different than the output of the other secondary flip-flops 104. If there are three secondary flip-flops 104 and output data value one of the secondary flip-flops is different than the output data value of the other two secondary flip-flops 104, then that secondary flip-flop 104 is detected to be in an error state. Other schemes for detecting interstate can be utilized without departing from the scope of the present disclosure.

In one embodiment, the error detection circuit 108 provides a same enable signal to the enable terminal of each of the secondary flip-flops 104. Accordingly, if any of the secondary flip-flops 104 is detected to be in an error state, then the enable signal goes high for all of the secondary flip-flops 104. This causes all of the secondary flip-flops 104 to provide the alternate input data value from the alternate data input terminal DiQ to the output terminal Q.

Figure 2:
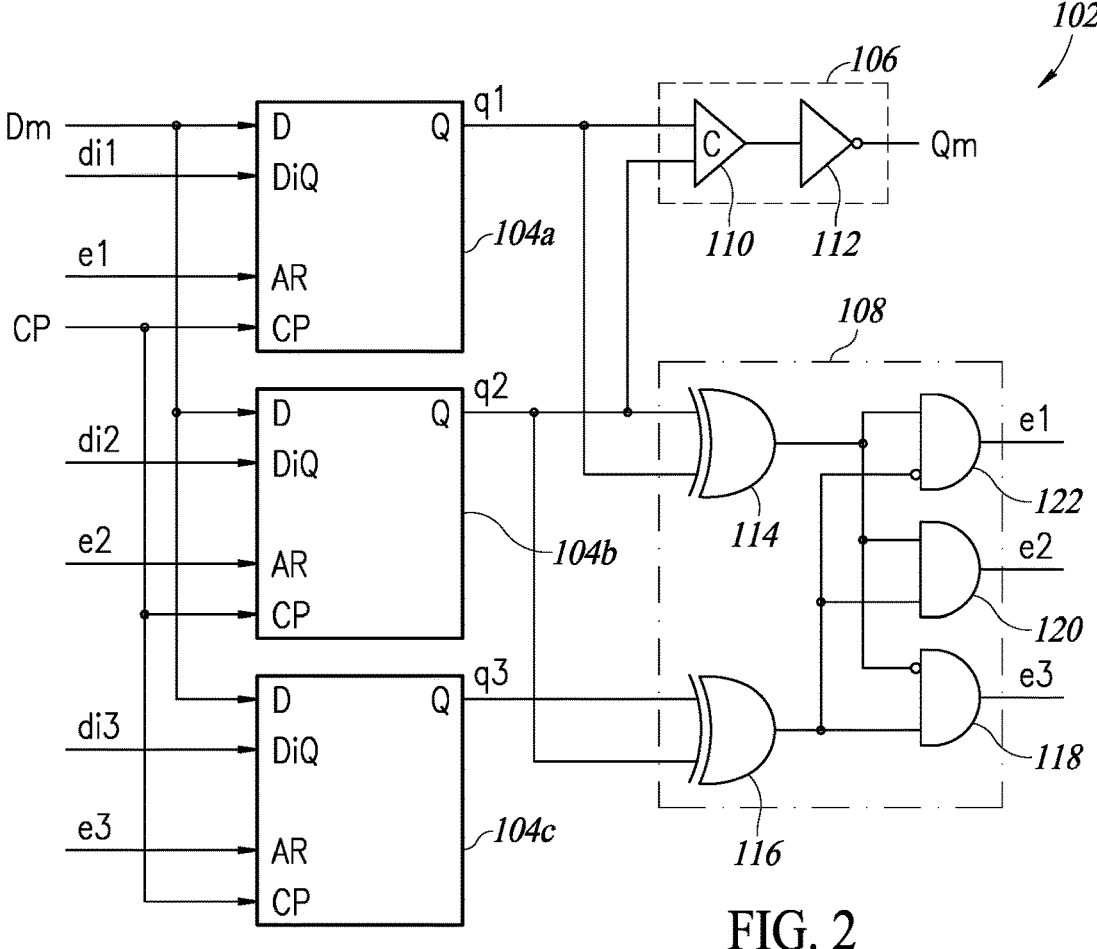
FIG. 2 is a block diagram of a main flip-flop, in accordance with some embodiments.

FIG. 2 is a schematic diagram of a main flip-flop 102, in accordance with one embodiment. The main flip-flop 102 of FIG. 2 is one example of a main flip-flop 102 of FIG. 1. The main flip-flop 102 of FIG. 2 includes three secondary flip-flops 104a, 104b, and 104c. In the following description, the suffix a, b, or c will be utilized in the reference number 104 when referring to a specific secondary flip-flop 104. The reference number 104 will be utilized without a suffix a, b, or c when referring generally to the secondary flip-flops 104.

Each secondary flip-flop 104 includes a data input terminal D. The data input terminal D receives the data value D of the main data input terminal Dm of the main flip-flop 102. In one embodiment, the data input terminals D of the secondary flip-flops 104 are shorted together.

Each secondary flip-flop 104 includes a data output terminal Q. The secondary flip-flop 104a outputs the output data value q1. The secondary flip-flop 104b outputs the output data value q2. The secondary flip-flop 104c outputs the output data value q3.

Each secondary flip-flop 104 includes an alternate data input terminal DiQ. The secondary flip-flop 104a receives at the alternate data input terminal DiQ the alternate data value d1. The secondary flip-flop 104b receives at the alternate data input terminal DiQ the alternate data value d2. The secondary flip-flop 104c receives at the alternate data input terminal DiQ the alternate data value d3.

Each secondary flip-flop 104 includes an enable terminal AR. The secondary flip-flop 104a receives the enable signal e1 at the enable terminal AR. The secondary flip-flop 104b receives the enable signal e2 at the enable terminal AR. The secondary flip-flop 104c receives the enable signal e3 at the enable terminal AR.

Each secondary flip-flop 104 includes a clock input terminal CP. In one embodiment, each secondary flip-flop 104 receives a same clock signal at the clock input terminal CP. During standard operation the enable signal e is low (or otherwise indicates no error state) and the input data value at the data input terminal D is provided to the data output terminal Q upon the rising or falling edge (as the case may be) of the clock signal CP.

If an error state is present at a secondary flip-flop 104, then the error signal e goes high (or otherwise indicates the presence of an error state). This causes the alternate input data value di to be passed to the data output terminal Q.

In one embodiment, the alternate input data value di is passed to the data output terminal Q without regard to the state of the clock signal CP. In other words, if an error state is detected and an enable signal e goes high for a particular secondary flip-flop 104, then the error state is corrected substantially immediately without regard for the clock signal CP. This has the advantage of ensuring that errors do not accumulate among the secondary flip-flops 104 even for low power devices in which the frequency of the clock signal CP is very low.

The main flip-flop 102 includes an error detection circuit one. The error detection circuit one includes a first 104aOR gate 114. A first input of the first 104aOR gate 114 is coupled to the data output terminal Q of the secondary flip-flop 104a and receives the output data value q1. A second input of the 104aOR gate 114 is coupled to the data output terminal Q of the secondary flip-flop 104b and receives the output data value q2.

The error detection circuit one includes a second 104aOR gate 116. A first input of the 104aOR gate 116 is coupled to the data output terminal Q of the secondary flip-flop 104c and receives the output data value q3. A second input of the second 104aOR gate 116 is coupled to the data output terminal Q of the secondary flip-flop 104b and receives the output data value q2.

The error detection circuit one includes an and gate 118, an and gate 120, and an and gate 122. The output of the 104aOR gate 114 is provided to a first input terminal of each of the and gates 118, 120, and 122. The first terminal of the and gate 118 inverts the value of the output of the 104aOR gate 114 or receives an inverted value of the output of the 104aOR gate 114. The output of the 104aOR gate 116 is provided to a second input terminal of each of the and gates 118, 120, and 122. The second input terminal of the and gate 122 inverts the output value of the 104aOR gate 116 or receives an inverted value of the output of the 104aOR gate 116.

The output of the and gate 118 is the enable signal e3. The output of the and gate 118 is coupled to the enable terminal AR of the secondary flip-flop 104c and provides the enable signal e3 to the enable signal AR of the secondary flip-flop 104c. Accordingly, the output of the and gate 118 indicates whether or not an error state is present at the secondary flip-flop 104c. The enable signal e3 will go high if the data value q3 is different than both of the data values q1 and q2.

The output of the and gate 120 is the enable signal e2. The output of the and gate 120 is coupled to the enable terminal AR of the secondary flip-flop 104b and provides the enable signal e2 to the enable signal AR of the secondary flip-flop 104b. Accordingly, the output of the and gate 120 indicates whether or not an error state is present at the secondary flip-flop 104c. The enable signal e2 will go high if the data value q2 is different than both of the data values q1 and q3.

The output of the and gate 122 is the enable signal e1. The output of the and gate 120 is coupled to the enable terminal AR of the secondary flip-flop 104a and provides the enable signal e1 to the enable signal AR of the secondary flip-flop 104a. Accordingly, the output of the and gate 122 indicates whether or not an error state is present at the secondary flip-flop 104a. The enable signal e1 will go high if the data value q1 is different than both of the data values q2 and q3. Other configurations of an error detection circuit one can be utilized without departing from the scope of the present disclosure.

The main flip-flop 102 includes an output circuit 106. The output circuit 106 includes a comparison circuit 110. The comparison circuit 110 includes a first input coupled to the data output terminal Q of the secondary flip-flop 104a and receives the data value q1. The comparison circuit 110 includes a second input coupled to the data output terminal Q of the secondary flip-flop 104b and receives the data value q2.

The output circuit 106 includes an inverter 112. The input of the inverter 112 is coupled to the output of the comparison circuit 110. The output of the inverter 112 is coupled to the main data output terminal QM of the main flip-flop 102. In other words, the output of the inverter 112 provides the output data value to the main the data output terminal QM. The function of the comparison circuit 110 in accordance with one embodiment, is described in relation to FIG. 3.

Figure 3:
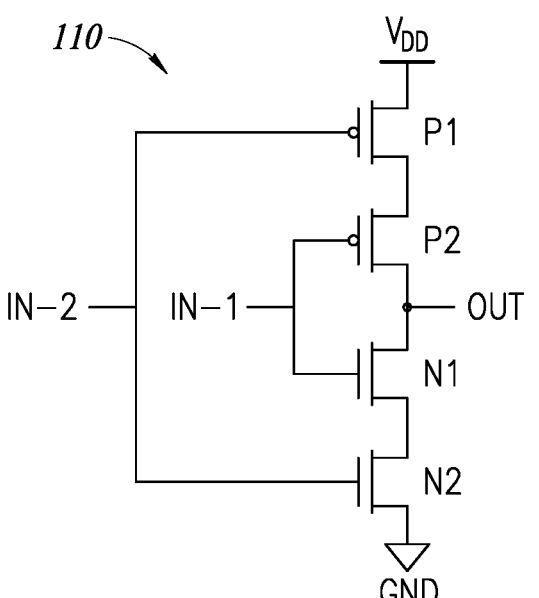
FIG. 3 is a block diagram of a comparison circuit of the main flip-flop, in accordance with some embodiments.

FIG. 3 is a schematic diagram of a comparison circuit 110, in accordance with one embodiment. FIG. 3 also provides a logic table 300 associated with the comparison circuit 110. The comparison circuit 110 includes a first input In1 (e.g., receiving the data value q1), a second input In2 (e.g., receiving the data value q2), and an output terminal OUT. The comparison circuit 110 includes PMOS transistors P1 and P2 coupled in series between supply voltage VDD and the output OUT. The comparison circuit 110 includes NMOS transistors coupled in series between OUT and ground. The gate terminals of the transistors P1 and N2 are coupled to IN2. The gate terminals of the transistors P2 and N1 are coupled to IN1.

The logic table 300 indicates the function of the comparison circuit 110. If the inputs IN1 and IN2 are both 0, then the output OUT can change to 1 or can remain at 1 if the value of OUT was already 1. If the inputs IN1 and IN2 are both 1, then the output OUT can change to 0 or can remain at 0 if the value of OUTPUT was already 0. If the inputs IN1 and IN2 are not identical to each other, then the output OUT or remain at its previous value. In other words, the output of the comparison circuit 110 can only change if the values of IN1 and IN2 agree with each other. The output of the output circuit 106 will be the opposite of the output of the comparison circuit 110 due to the presence of the inverter 112 (see FIG. 2). Other configurations of a comparison circuit 110 can be utilized without departing from the scope of the present disclosure.

Figure 4:
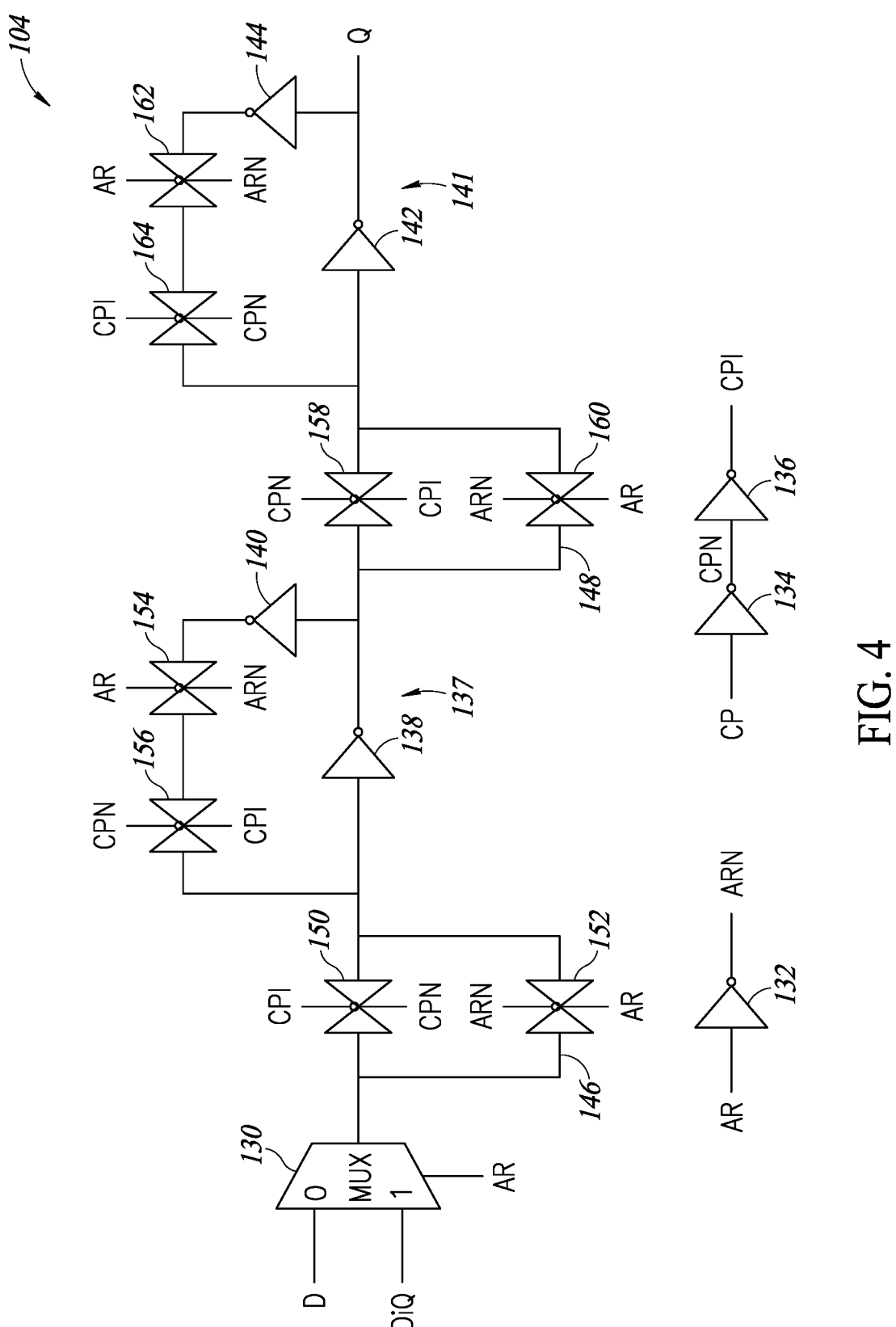
FIG. 4 is a schematic diagram of a secondary flip-flop of the main flip-flop, in accordance with some embodiments.

FIG. 4 is a schematic diagram of a secondary flip-flop 104, according to one embodiment. The secondary flip-flop 104 of FIG. 4 is one example of a secondary flip-flop 104 of FIG. 1 or 2. The secondary flip-flop 104 of FIG. 4 will provide the alternate input data value di from the alternate data input terminal DiQ to the data output terminal Q without regard to the state of the clock signal CP. In other words, when the enable signal at the enable terminal AR goes high, the alternate input data value di will be passed substantially immediately to the data output terminal Q.

The secondary flip-flop 104 includes a multiplexer 130. The multiplexer 130 includes a first input coupled to the data input terminal D. The multiplexer 130 includes a second input coupled to the alternate data input terminal DiQ. The multiplexer 130 includes a selection input coupled to the enable terminal AR. Accordingly, the selection input receives the enable signal e. If the enable signal is 0, then the multiplexer 130 outputs the input data value from the data input terminal D. If the enable signal is 1, then the multiplexer 130 outputs the alternate input data value from the alternate data input terminal DiQ.

The secondary flip-flop 104 includes an inverter 132. The input of the inverter 132 is coupled to the enable signal AR and outputs a complementary enable signal ARN that is the logical complement of the enable signal at AR.

The secondary flip-flop 104 includes a pair of inverters 134 136 connected in series. The input of the inverter 134 receives the clock signal CP and outputs the complementary clock signal CPN that is the logical complement of the clock signal CP. The input of the inverter 136 receives the complementary clock signal CPN and outputs the clock signal CPI that is the logical complement of CPN. Accordingly, CPI corresponds to the clock signal CP, but possibly with a slight delay.

The secondary flip-flop 104 includes a first latch 137. The first latch 137 corresponds to a master latch of the flip-flop 104. The first latch 137 includes a first inverter 138 and a second inverter 140 cross coupled together. The output of the inverter 138 is the output of the first latch 137.

The secondary flip-flop 104 includes a second latch 141. The second latch 141 corresponds to a slave latch of the flip-flop 104. The second latch 141 includes a first inverter 142 and a second inverter 144 cross coupled together. The output of the inverter 142 corresponds to the output of the second latch 141 and to the data output terminal Q of the secondary flip-flop 104.

The secondary flip-flop 104 includes a pass gate 150 coupled between the output of the multiplexer 130 and the input of the inverter 138. The pass gate 150 receives the clock signals CPI and CPN and is therefore controlled by the clock signals CPI and CPN. When CPI is low, the pass gate 150 is enabled. When CPI is high, the pass gate 150 is disabled.

The secondary flip-flop 104 includes an alternate loop 146 that bypasses the pass gate 150. The alternate loop 146 includes a pass gate 152. The pass gate 152 receives the signals ARN and AR and is therefore controlled by ARN and AR. The pass gate 152 is enabled when AR is high.

The secondary flip-flop 104 includes a pass gate 158 coupled between the output of the inverter 137 and the input of the inverter 142. The pass gate 158 receives the clock signals CPI and CPN. When CPI is high, the pass gate 158 is enabled. When CPI is low, the pass gate 158 is disabled.

The secondary flip-flop 104 includes an alternate loop 148 that bypasses the pass gate 158. The alternate loop 148 includes a pass gate 160. The pass gate 160 receives the signals ARN and AR. The pass gate 152 is enabled when AR is high.

The secondary flip-flop includes a pass gate 154 and a pass gate 156 coupled in series between the output of the inverter 140 and the input of the inverter 138. The pass gate 154 receives AR and ARN as control signals. The pass gate 154 is enabled when AR is low and is disabled when AR is high. The pass gate 156 receives CPN and CPI as control signals. The pass gate 156 is enabled when CPI is high and is disabled when CPI is low.

The secondary flip-flop includes a pass gate 162 and a pass gate 164 coupled in series between the output of the inverter 143 and the input of the inverter 142. The pass gate 162 receives AR and ARN as control signals. The pass gate 162 is enabled when AR is low and is disabled when AR is high. The pass gate 164 receives CPN and CPI as control signals. The pass gate 164 is enabled when CPI is low and is disabled when CPI is high.

The function of the secondary flip-flop 104 will now be described. The enable signal AR determines whether the secondary flip-flop 104 will operate in a standard operating mode or whether the secondary flip-flop 104 will operate in alternate operating mode. In the standard operating mode, the input data value at the data input terminal D is provided from the multiplexer 130 and the clock signal CP controls the operation of the secondary flip-flop 104. In the alternate operating mode, the alternate input data value from the alternate data input terminal DiQ is output from the multiplexer 130 and the clock signal CP does not control the function of the secondary flip-flop 104.

In the standard operating mode AR is low and ARN is high. This causes the pass gates 152 and 160 to be disabled, thereby disabling the alternate loops 146 and 148. In the standard operating mode, the pass gates 154 and 162 are enabled. When CPI is low, the pass gate 150 is enabled in the data value is provided from D to the first latch 137. The pass gate 156 is disabled. Accordingly, the complement of the input data value from the data input terminal D is provided at the output of the first latch 137. The pass gate 158 is disabled, preventing the inverse data value at the output of the first latch 137 from being passed to the input of the second latch 141.

In the standard operating mode, upon the clock signal CPI going high, the pass gate 150 is disabled and the pass gate 158 is enabled. The result is that the inverse data value at the output of the latch 137 is provided to the input of the latch 141. The inverter 142 inverts the output of the latch 137 and provides the input data value at the data output terminal Q. Furthermore, the pass gate 164 is disabled and the pass gate 156 is enabled while CPI is high. Accordingly, the basic principle in the standard operating mode is that whatever data value is that the data input terminal D at the rising edge of the clock signal CPI will be provided to the data output terminal Q. Any change at the data input terminal D after the rising edge of CPI will not be provided to the data output terminal Q until the next rising edge of CPI.

When the enable signal goes high (AR is high, indicating an error state), the multiplexer 130 outputs the alternate data value from the alternate data input terminal DiQ. The pass gate 152 is enabled, thereby enabling the alternate loop 146 and bypassing the pass gate 150. The inverter 138 inverts the alternate data value. The pass gate 160 is enabled, thereby enabling the alternate loop 148 and bypassing the pass gate 150. The inverter 142 inverts the output of the inverter 138 and thereby provides the alternate data value to the data output terminal Q. Due to the presence of the enabled alternate loops 146 and 148, the clock signal CPI no longer has any effect on the secondary flip-flop 104 and the alternate data value can be provided to the data output terminal Q substantially immediately. Other configurations of a secondary flip-flop 104 can be utilized without departing from the scope of the present disclosure.

Figure 5:
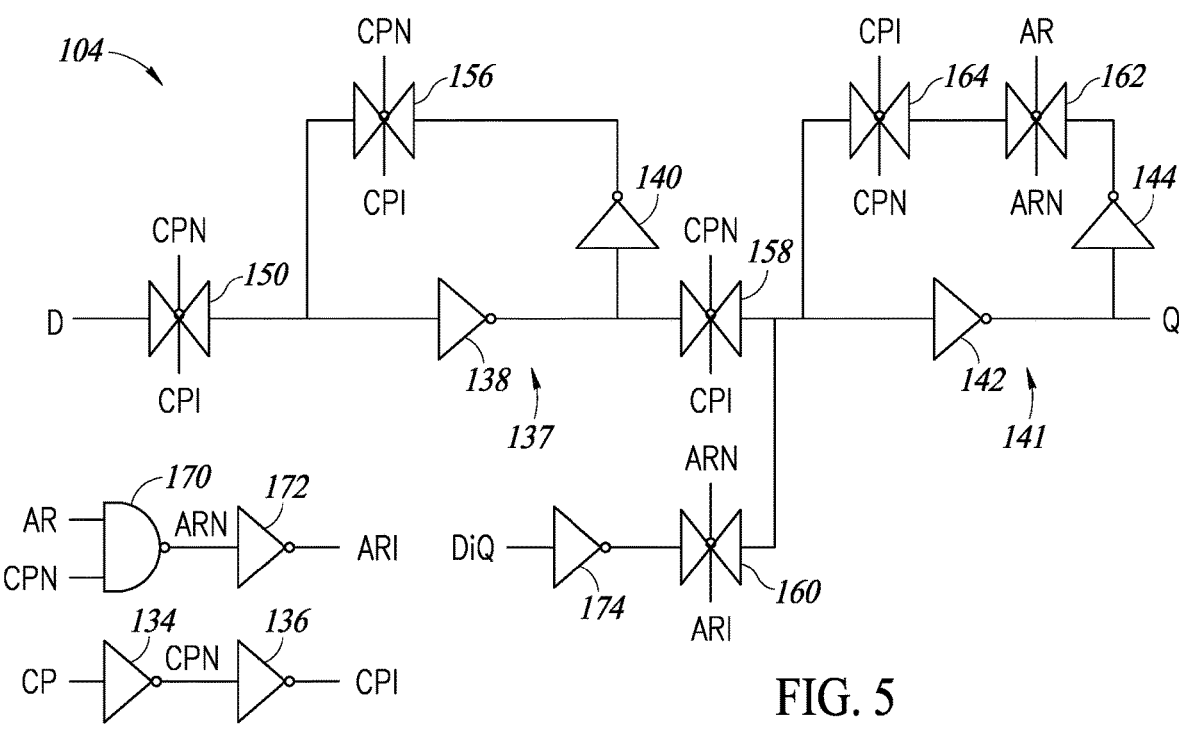
FIG. 5 is a schematic diagram of a secondary flip-flop of the main flip-flop, in accordance with some embodiments.

FIG. 5 is a schematic diagram of a secondary flip-flop 104, according to one embodiment. The secondary flip-flop 104 of FIG. 5 is one example of a secondary flip-flop 104 of FIG. 1 or 2. The function of the secondary flip-flop 104 of FIG. 5 differs from the function of the secondary flip-flop 104 of FIG. 4 in that the provision of the alternate data value to the data output terminal Q is affected by the clock signal CPI. The structure of the secondary flip-flop 104 of FIG. 50 overlaps with the secondary flip-flop 104 of FIG. 4. Accordingly, common components have the same reference numbers.

The secondary flip-flop 104 of FIG. 5 generates CPN and CPI from CP in the same way as shown in FIG. 5. The secondary flip-flop 104 of FIG. 5 generates ARN and a signal ARI that is the logical complement of ARN. A NAND gate 170 receives as inputs AR and CPN. ARN goes low only when both AR and CPN are high. Accordingly, ARI only goes high when AR is high and CPI is low. The secondary The secondary flip-flop 104 of FIG. 5 does not include the multiplexer 130, the alternate loop 146, the pass gate 152, and the pass gate 154. The secondary flip-flop 104 of FIG. 5 includes an inverter 174 coupled between the alternate data input DiQ and the pass gate 160. The input of the inverter 174 receives the alternate data value from the alternate data input terminal DiQ. In the standard operating mode (error is not present, AR is low), the flip-flop 104 of FIG. 5 operates the same way as the secondary flip-flop 104 of FIG. 4.

In the alternate operating mode (error is present, AR is high), the alternate data value will be provided from the alternate data input terminal DiQ on the falling edge of the clock signal CPI. When CPI goes low, the pass gate 158 is disabled, thereby cutting off the input of the inverter 142 from the data input terminal D. ARI goes high, thereby enabling the pass gate 160 and providing the inverted alternate input data value to the input of the inverter 142. The inverter 142 then outputs the alternate input data value to the data output terminal Q. Accordingly, when AR goes high, the alternate data values only provided to the data output terminal Q upon the falling edge of the clock signal CPI.

Figure 6:
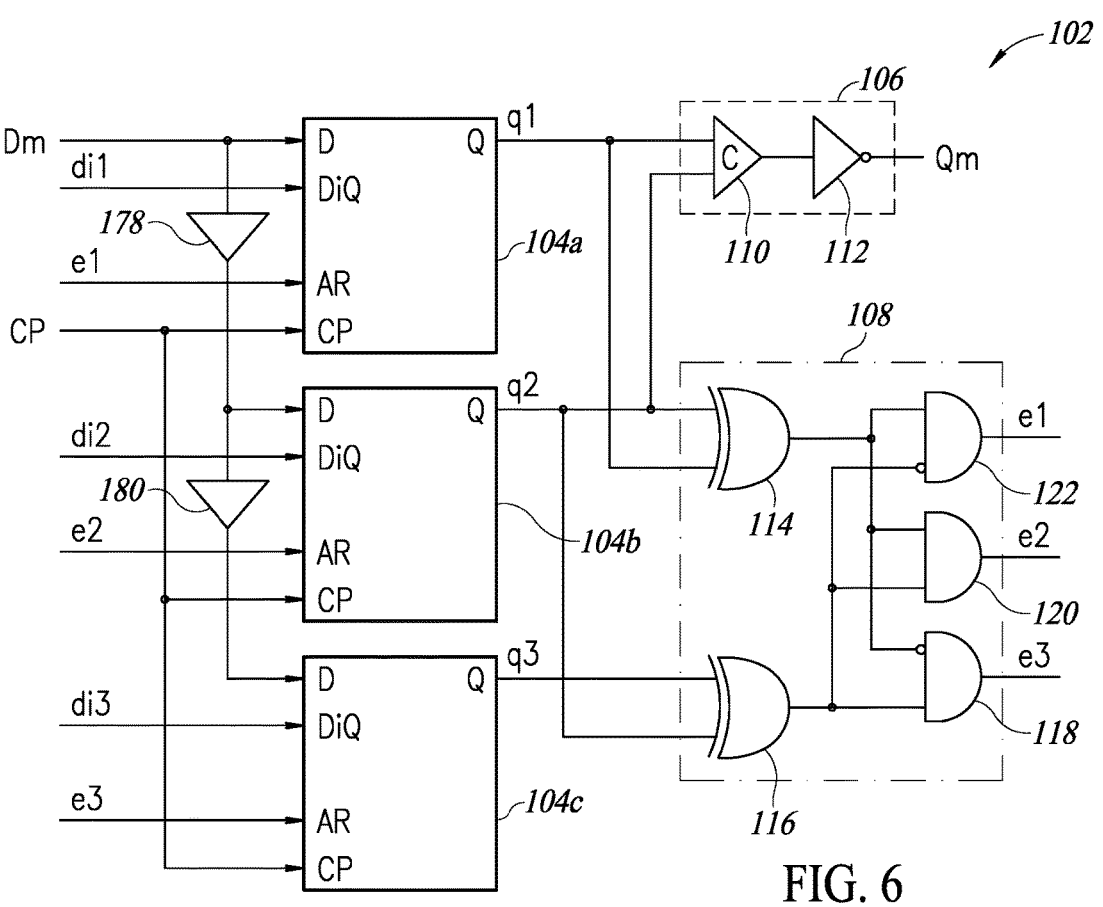
FIG. 6 is a block diagram of a main flip-flop, in accordance with some embodiments.

FIG. 6 is a schematic diagram of a main flip-flop 102, according to one embodiment. The main flip-flop 102 of FIG. 6 is one example of a main flip-flop 102 of FIG. 1. The main flip-flop 102 of FIG. 6 is substantially identical to the main flip-flop 102 of FIG. 2, except for the presence of delay elements 178 and 180. In particular, there is a delay element 178 between the data input terminal D of the secondary flip-flop 104a and the data input terminal D of the secondary flip-flop 104b. The result is that the input data value from the main data input Dm arrives at the data input terminal D of the secondary flip-flop 104b with a delay relative to the secondary flip-flop 104a. The delay element 180 is coupled between the data input terminal D of the secondary flip-flop 104b and the data input terminal D of the secondary flip-flop 104c. The result is that the input data value from the main data input Dm arrives at the data input terminal D of the secondary flip-flop 104c with a delay relative to the secondary flip-flop 104b.

Due to the delays 178 and 180, one of the outputs Q will always have a different value than the input of the main data input terminal Dm. This can provide for the correction of errors due to both single even upsets and single event transients. The error detection circuit can 108 can then generate timing error signals which can be used for error timing pre-error detection. This signal can further be exploited by system designers to perform dynamic voltage and frequency scaling based on in-situ timing monitors.

Figure 7:
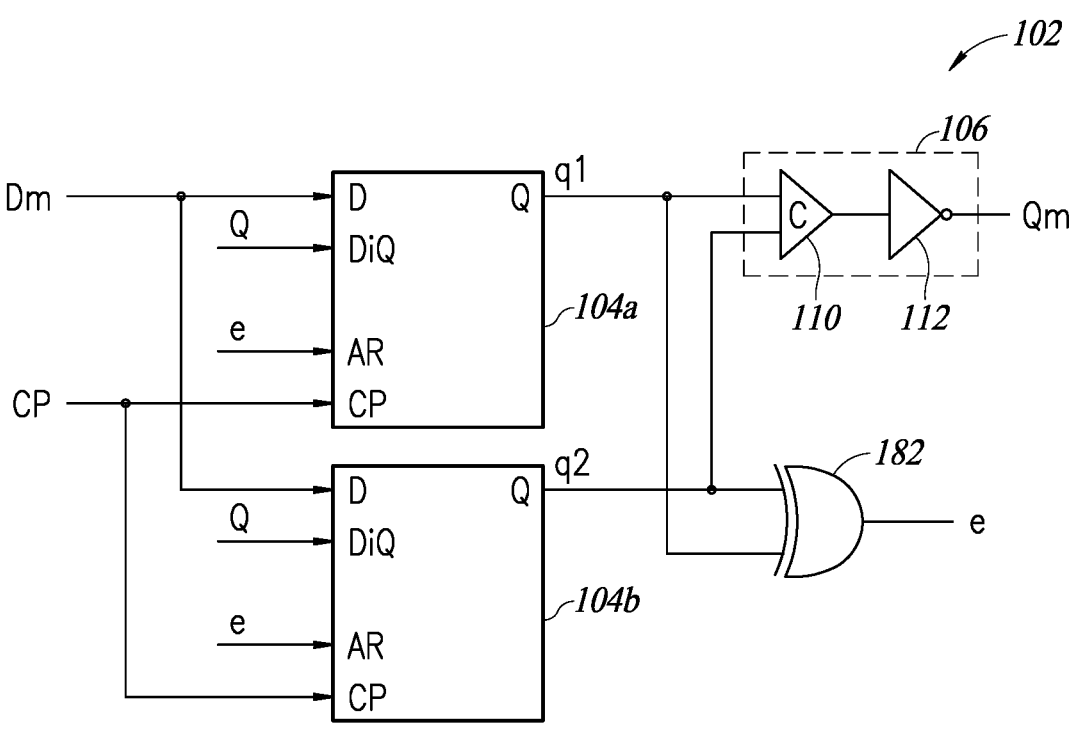
FIG. 7 is a block diagram of a main flip-flop, in accordance with some embodiments.

FIG. 7 is a schematic diagram of a main flip-flop 102, according to one embodiment. The main flip-flop 102 of FIG. 7 is one example of a main flip-flop 102 of FIG. 1. The main flip-flop 102 of FIG. 7 includes overlapping structure with the main flip-flop 102 of FIG. 2. In FIG. 7, only two secondary flip-flops 104a and 104b are present. The error detection circuit one includes only a single 104aOR gate 182 receiving the outputs q1 and q2 from the secondary flip-flops 104a and 104b. The 104aOR gate 182 generates and enable signal e that is provided to both of the enable terminals AR of the secondary flip-flops 104a and 104b. Furthermore, the alternate data input terminals of the secondary flip-flops 104a and 104b both receive the data value from the main data output terminal Qm.

The main flip-flop 102 of FIG. 7 may not be as robust in error correction as the main flip-flop 102 of FIG. 2. However, the main flip-flop 102 of FIG. 7 is still capable of error detection and utilizes integrated circuit area due to the presence of fewer components.

Figure 8:
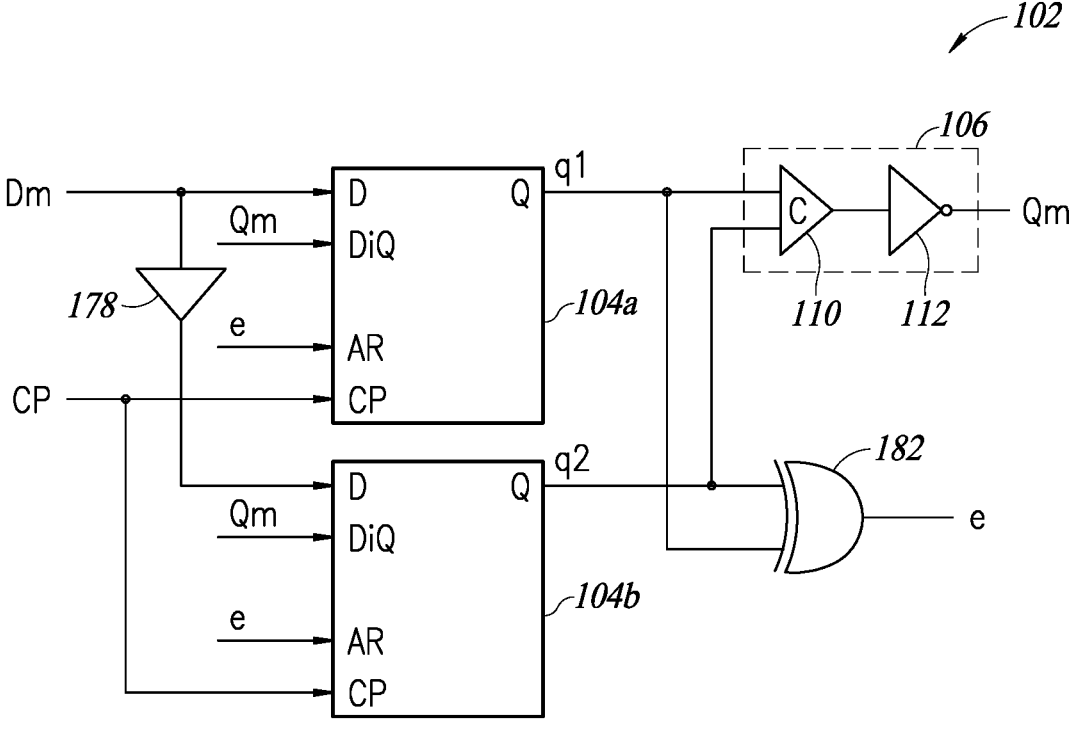
FIG. 8 is a block diagram of a main flip-flop, in accordance with some embodiments.

FIG. 8 is a schematic diagram of a main flip-flop 102, according to one embodiment. The main flip-flop 102 of FIG. 8 is one example of a main flip-flop 102 of FIG. 1. The main flip-flop 102 of FIG. 8 includes overlapping structure with the main flip-flop 102 of FIG. 6. In FIG. 8, only two secondary flip-flops 104a and 104b are present. Only a single delay element 78 is present. The error detection circuit one includes only a single 104aOR gate 182 receiving the outputs q1 and q2 from the secondary flip-flops 104a and 104b. The 104aOR gate 182 generates and enable signal e that is provided to both of the enable terminals AR of the secondary flip-flops 104a and 104b. Furthermore, the alternate data input terminals of the secondary flip-flops 104a and 104b both receive the data value from the main data output terminal Qm.

The main flip-flop 102 of FIG. 8 may not be as robust in error correction as the main flip-flop 102 of FIG. 2. However, the main flip-flop 102 of FIG. 8 is still capable of error detection and utilizes integrated circuit area due to the presence of fewer components.

FIG. 9 is a flow diagram of a method 900, according to one embodiment. The method 900 can utilize systems, processes, and components described in relation to FIGS. 1-8. At 902, the method 900 includes receiving, at a main input terminal of a main flip-flop, a data value, the main flip-flop including a plurality of secondary flip-flops. At 904, the method 900 includes providing the data value from the main input terminal to a respective data input terminal of each of a plurality of secondary flip-flops, each secondary flip-flop including an alternate data input terminal, an enable terminal, and an output terminal. At 906, the method 900 includes receiving, at the alternate input terminal of each secondary flip-flop, a respective alternate input data value. At 908, the method 900 includes outputting, from the output terminal of each of the secondary flip-flops, a respective output data value to an error detection circuit. At 910, the method 900 includes outputting, from the error detection circuit, a respective enable signal to the enable terminal of each secondary flip-flop. At 912, the method 900 includes for each secondary flip-flop, selectively passing to the output terminal of the secondary flip-flop either the data value or the alternate input data value based on the enable signal.

FIG. 10 is a flow diagram of a method 1000, according to one embodiment. The method 1000 can utilize systems, processes, and components described in relation to FIGS. 1-9. At 1002, the method 1000 includes providing an input data value of a main flip-flop to a data input terminal of each of a plurality of secondary flip-flops of the main flip-flop. At 1004, the method 1000 includes receiving, at an alternate data input terminal of each of the secondary flip-flops, a respective alternate input data value. At 1006, the method 1000 includes detecting, for each secondary flip-flop with an error detection circuit of the main flip-flop, whether an error state is present at the secondary flip-flop. At 1008, the method 1000 includes selectively outputting, for each secondary flip-flop, the alternate input data value as an output data value based on whether or not the error state is present.

In embodiment, a device includes a main flip-flop including a main data input terminal, a main data output terminal, and a plurality of secondary flip-flops. Each secondary flip-flop includes a data input terminal coupled to the main data input terminal, a data output terminal, an alternate data input terminal; and an enable terminal configured to selectively enable the data input port or the data output port.

In one embodiment, a method includes receiving, at a main input terminal of a main flip-flop, a data value, the main flip-flop including a plurality of secondary flip-flops and providing the data value from the main input terminal to a respective data input terminal of each of a plurality of secondary flip-flops. Each secondary flip-flop including an alternate data input terminal, an enable terminal, and an output terminal. The method includes receiving, at the alternate input terminal of each secondary flip-flop, a respective alternate input data value and outputting, from the output terminal of each of the secondary flip-flops, a respective output data value to an error detection circuit. The method includes outputting, from the error detection circuit, a respective enable signal to the enable terminal of each secondary flip-flop and for each secondary flip-flop, selectively passing to the output terminal of the secondary flip-flop either the data value or the alternate input data value based on the enable signal.

In one embodiment, a method includes providing an input data value of a main flip-flop to a data input terminal of each of a plurality of secondary flip-flops of the main flip-flop and receiving, at an alternate data input terminal of each of the secondary flip-flops, a respective alternate input data value. The method includes detecting, for each secondary flip-flop with an error detection circuit of the main flip-flop, whether an error state is present at the secondary flip-flop and selectively outputting, for each secondary flip-flop, the alternate input data value as an output data value based on whether or not the error state is present.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a main flip-flop including:
    a main data input terminal;
    a main data output terminal; and
    a plurality of secondary flip-flops each having:
    a data input terminal coupled to the main data input terminal;
    a data output terminal;
    an alternate data input terminal; and
    an enable terminal configured to selectively enable the data input terminal or the data output terminal.

2. The device of claim 1, wherein the main flip-flop includes an error detection circuit having:
    an input side coupled to the data output of each of the secondary flip-flops; and
    an output side coupled to the alternate data input terminal of each of the secondary flip-flops.

3. The device of claim 2, wherein the output side of the error detection circuit outputs a respective enable signal to the enable terminal of each secondary flip-flop.

4. The device of claim 3, wherein respective enable signal indicates whether or not an error state has been detected for the corresponding secondary flip-flop.

5. The device of claim 4, wherein the plurality of secondary flip-flops includes:
    a first secondary flip-flop, wherein the output side of the error detection circuit outputs a first enable signal to the enable terminal of the first secondary flip-flop;
    a second secondary flip-flop, wherein the output side of the error detection circuit outputs a second enable signal to the enable terminal of the second secondary flip-flop; and
    a third secondary flip-flop, wherein the output side of the error detection circuit outputs a third enable signal to the enable terminal of the third secondary flip-flop.

6. The device of claim 2, wherein the plurality of secondary flip-flops includes:
    a first secondary flip-flop; and
    a second secondary flip-flop, wherein the output side of the error detection circuit outputs an enable signal to the enable terminal of the first secondary flip-flop and to the enable terminal of the second secondary flip-flop.

7. The device of claim 6, wherein the enable signal indicates whether there is an error state among at one of the first and second secondary flip-flops.

8. The device of claim 2, wherein the alternate data input terminal of each secondary flip-flop is connected to the main output of the main flip-flop.

9. The device of claim 2, wherein the alternate data input terminal of each secondary flip-flop is connected to the output terminal of another of the plurality of secondary flip-flops.

10. The device of claim 2, wherein the main flip-flop includes a comparison circuit having:
    an input side coupled to the data output terminals of two or more of the secondary flip-flops; and
    an output side configured to provide a data value to the main output terminal.

11. The device of claim 10, wherein the main flip-flop includes an inverter coupled between the output side of the comparison circuit and the main output terminal.

12. A method, comprising:
    receiving, at a main input terminal of a main flip-flop, a data value, the main flip-flop including a plurality of secondary flip-flops;
    providing the data value from the main input terminal to a respective data input terminal of each of a plurality of secondary flip-flops, each secondary flip-flop including an alternate data input terminal, an enable terminal, and an output terminal;
    receiving, at the alternate data input terminal of each secondary flip-flop, a respective alternate input data value;
    outputting, from the output terminal of each of the secondary flip-flops, a respective output data value to an error detection circuit;
    outputting, from the error detection circuit, a respective enable signal to the enable terminal of each secondary flip-flop; and
    for each secondary flip-flop, selectively passing to the output terminal of the secondary flip-flop either the data value or the alternate input data value based on the enable signal.

13. The method of claim 12, wherein each respective enable signal indicates whether or not an error state has been detected for the corresponding secondary flip-flop.

14. The method of claim 12, comprising generating a main output data value of the flip-flop based on the output data value of two or more of the secondary flip-flops.

15. The method of claim 14, comprising receiving, at the alternate data input terminal of each secondary flip-flop, the main output data value as the alternate input data value.

16. The method of claim 14, comprising receiving, at the alternate data input terminal of each secondary flip-flop, the output data value of another of the secondary flip-flops.

17. The method of claim 12, generating the main output data value with a comparison circuit based on the output data value of two or more of the secondary flip-flops.

18. A method, comprising:

providing an input data value of a main flip-flop to a data input terminal of each of a plurality of secondary flip-flops of the main flip-flop;

receiving, at an alternate data input terminal of each of the secondary flip-flops, a respective alternate input data value;

detecting, for each secondary flip-flop with an error detection circuit of the main flip-flop, whether an error state is present at the secondary flip-flop; and selectively outputting, for each secondary flip-flop, the alternate input data value as an output data value based on whether or not the error state is present.

19. The method of claim 18, comprising generating a main output value of the main flip-flop based on the output data value of two or more of the secondary flip-flops.

20. The method of claim 18, comprising:

changing the main output value only if the two or more output data values are all the same; and retaining a previous value of the main output value if the two or more output data values are not all the same.

\* \* \* \* \*